US009937743B2

(12) United States Patent
Aizenberg et al.

(10) Patent No.: US 9,937,743 B2
(45) Date of Patent: Apr. 10, 2018

(54) ANTI-COUNTERFEITING METHODS

(71) Applicant: President and Fellows of Harvard College, Cambridge, MA (US)

(72) Inventors: Joanna Aizenberg, Boston, MA (US); Tak Sing Wong, State College, PA (US); Sung Hoon Kang, Cambridge, MA (US); Ximin He, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 309 days.

(21) Appl. No.: 14/404,117

(22) PCT Filed: May 31, 2013

(86) PCT No.: PCT/US2013/043627
§ 371 (c)(1),
(2) Date: Nov. 26, 2014

(87) PCT Pub. No.: WO2013/181540
PCT Pub. Date: Dec. 5, 2013

(65) Prior Publication Data
US 2015/0137502 A1    May 21, 2015

Related U.S. Application Data

(60) Provisional application No. 61/654,462, filed on Jun. 1, 2012.

(51) Int. Cl.
*G06K 19/00* (2006.01)
*B42D 25/351* (2014.01)
(Continued)

(52) U.S. Cl.
CPC ............ *B42D 25/351* (2014.10); *B32B 27/08* (2013.01); *B42D 25/00* (2014.10); *B42D 25/23* (2014.10);
(Continued)

(58) Field of Classification Search
CPC .............................. B42D 15/10; G07F 7/1008
(Continued)

(56) References Cited

U.S. PATENT DOCUMENTS 6,312,442 B1    11/2001  Kieturakis et al.
2004/0051297 A1*  3/2004  Raksha ................. B05D 3/207
                                                     283/57
(Continued)

FOREIGN PATENT DOCUMENTS

EP         0389274 A2     9/1990
WO    WO-2010/115928 A2  10/2010

OTHER PUBLICATIONS

International Search Report and Written Opinion issued by the International Searching Authority for International Application No. PCT/US2013/043627 dated Aug. 22, 2013 (12 pages).

*Primary Examiner* — Daniel St Cyr
(74) *Attorney, Agent, or Firm* — Wilmer Cutler Pickering Hale and Don LLP

(57) ABSTRACT

A document and an Anti-counterfeiting method for use in such documents are described. Said document and Anti-counterfeiting method include introducing a plurality of raised nanoscopic to microscopic structures, here referred to as reconfigurable structures, formed over a polymer substrate to induce optical changes, such as structural color and/or optical fuzziness. Dynamic changes using liquids provide the anti-counterfeiting measures.

18 Claims, 12 Drawing Sheets

(51) Int. Cl.
  *B42D 25/24* (2014.01)
  *B32B 27/08* (2006.01)
  *B42D 25/29* (2014.01)
  *B42D 25/342* (2014.01)
  *B42D 25/00* (2014.01)
  *B42D 25/23* (2014.01)
  *B81B 3/00* (2006.01)
  *G07D 7/00* (2016.01)
  *B42D 25/324* (2014.01)
  *G02B 5/18* (2006.01)

(52) U.S. Cl.
  CPC .............. *B42D 25/24* (2014.10); *B42D 25/29* (2014.10); *B42D 25/342* (2014.10); *B81B 3/0083* (2013.01); *G07D 7/003* (2017.05); *B42D 25/324* (2014.10); *B42D 2033/30* (2013.01); *B42D 2035/20* (2013.01); *B42D 2035/24* (2013.01); *B42D 2035/34* (2013.01); *B81B 2201/00* (2013.01); *G02B 5/1828* (2013.01)

(58) Field of Classification Search
  USPC .................................. 235/487, 491, 380, 379
  See application file for complete search history.

(56) References Cited

U.S. PATENT DOCUMENTS

| | | | |
|---|---|---|---|
| 2007/0077396 A1 | 4/2007 | Aizenberg et al. | |
| 2011/0256349 A1 | 10/2011 | Lee et al. | |
| 2012/0161431 A1* | 6/2012 | Vulpius | B29C 55/023 283/85 |
| 2013/0003150 A1* | 1/2013 | Camus | G03H 1/24 359/2 |
| 2013/0056972 A1* | 3/2013 | Muller | B29D 11/00663 283/85 |

* cited by examiner

ANTI-COUNTERFEITING METHODS

CROSS REFERENCES TO RELATED APPLICATIONS

This application is a National Stage Entry of PCT International Application No. PCT/US2013/043627 filed on May 31, 2013 which claims the benefit of priority under 35 C.F.R. § 119(e) to U.S. Patent Application No. 61/654,462, filed on Jun. 1, 2012, the content of which is incorporated by reference herein by its entirety.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

FIELD OF THE INVENTION

The present application relates to anti-counterfeiting methods. More particularly, the present application relates to ink-free anti-counterfeiting methods utilizing three-dimensional nano/micromechanical structures.

BACKGROUND

The inception of the first polymer-based banknotes in Australia in 1988 (see FIG. 1A) has provided a new perspective to the global economic security. The new polymer banknote material, named GUARDIAN, was developed jointly by the Reserve Bank of Australia, Commonwealth Scientific and Industrial Research Organization (CSIRO), and the University of Melbourne. Besides GUARDIAN as the currently most used material, a few other types of polymer banknotes have been developed, namely TYVEK by DuPont and American Bank Note Company in 1980s and DURANOTES by Canada's AGRA and the US Mobil Chemical.

At present, there are at least 30 different denominations totaling >3 billions polymer-based banknotes that are currently circulating in ~30 countries, which accounts for ~15% of the total independent countries in the world. Additional countries, including European Union, Canada, Switzerland, and India, have plans to issue polymer banknotes starting from 2011 and beyond.

Counterfeiting is one of the top issues of banknotes. Taking United States as an example, its currency is known to be vulnerable to counterfeiting because its design was created in 1920s and it is an international currency valued all over the world. With rapid improvement in printing technology, such as high resolution scanners and printers, there has been a growing number of counterfeiting events. In 1995 only, over 360 million counterfeit notes were confiscated, and it is estimated that more than billion dollars were undetected. This counterfeited money is used for arm purchase, drug trade and terrorist activity, which is a serious threat for homeland security as well as international welfare.

Polymer bank notes have provided a strong barrier to counterfeiters in many countries. For example, since the 20-Mexican peso polymer banknotes introduction in 2002, Mexico has seen a dramatic decrease of the number of detected counterfeit 20-peso banknotes by 96% in the following years. However, the cost of polymeric banknote manufacturing at present is still higher than that of paper-based banknotes. Effective yet inexpensive counterfeiting techniques with polymer materials are still lacking.

Secure, durable, and printable are the three technical criteria for Central Banks to purchase banknote materials. Security as the universal philosophy requires the features to be difficult to be counterfeited, yet they have to be simple enough for the general public to recognize. Hence, the transformation proceeding of paper-based banknotes to polymer-based banknotes highly rely on the degree of difficulty for counterfeiting, robustness for long-term use and printing cost as some of the key determinative aspects. In the case of U.S., ~1700 billions of US dollars are circulating in the world, according to the Federal Reserve by October 2010. The cost of printing a paper-based banknote is ~$0.04, while the circulation time of current paper/cotton-based banknotes is only ~18 months on average, in comparison to the 4-year life time of polymeric banknotes. The estimated potential impact of transforming all current paper-based U.S. banknotes into polymer-based ones is of 0.68 billion to 68 billion. As a result, there is a great demand in developing advanced anti-counterfeiting features specifically for polymer-based banknotes.

Owing to the unique material properties and manufacturing techniques of the polymer thin film, new security features were introduced into the polymer-based banknotes that were not available to the paper-based ones. For instance, GUARDIAN banknote employs optical transparent windows with embossed microscale features which are incorporated within the polymer substrate, as shown in FIG. 1B. Two-dimensional (2D) optical devices, in the form of diffraction gratings (G-SWITCH, 102), iridescent bands (IRISWITCH, 103), and shadow images (SHAD H2O SWITCH, 104), can also be introduced into the optically transparent window (WINTHRU, 101) through embossing techniques. While the introduction of these new anti-counterfeiting features into polymer-based banknotes has greatly increased the currency security, the full potential of anti-counterfeiting methods suitable for polymer substrate has not yet been realized.

SUMMARY

In accordance with certain embodiments, a suite of ink-free anti-counterfeiting methods utilizing three-dimensional nano/micromechanical structures are described.

In certain embodiments, the structures are capable of producing dynamic, visually distinctive optical effects in wet and/or dry environments for enhance security features.

In certain embodiments, the three-dimensional nano/micromechanical structures can be fabricated on polymer substrates.

In certain embodiments, a document that includes a security element is provided. The security element can include a polymer layer comprising a plurality of reconfigurable structures formed on a surface of the polymer layer; wherein the plurality of reconfigurable structures have a geometry and configuration capable of providing an optical effect that is visible with the human eye, the plurality of reconfigurable structures are capable of altering its configuration and corresponding optical effect upon application of a liquid, and the reconfigurable structures are formed over at least a portion of the document.

In certain embodiments, the plurality of raised structures have a geometry and configuration to provide a structural color.

In certain embodiments, the document further includes a liquid to be provided to the plurality of reconfigurable structures to form a change in the structural color.

In certain embodiments, the document further includes a security information below the plurality of reconfigurable structures, wherein the plurality of reconfigurable structures have a geometry and configuration to diffract light and cause an optical fuzziness of the underlying security information.

In certain embodiments, the document further includes a liquid to be provided to the plurality of reconfigurable structures that has a refractive index that is similar to the refractive index of the plurality of reconfigurable structures.

In certain embodiments, the document is a banknote, credit card, traveler's cheque, or a personal identification document.

In certain embodiments, the document is a banknote.

In certain embodiments, the document is a passport or a driver's license.

In certain embodiments, the plurality of reconfigurable structures is a polymer.

In certain embodiments, the polymer substrate and the reconfigurable structures comprise polypropylene, polyethylene, or combinations thereof.

In accordance with certain embodiments, a method for screening a document is provided. In certain embodiments, method includes providing a document having a security element that comprises a polymer layer having a plurality of reconfigurable structures formed on a surface of the polymer layer, wherein the plurality of reconfigurable structures have a geometry and configuration capable of providing an optical effect that is visible with the human eye; and introducing a liquid to the plurality of reconfigurable structures to form a change in the configuration and corresponding optical effect.

In certain embodiments, the plurality of reconfigurable structures have a geometry and configuration to provide a structural color.

In certain embodiments, introducing a liquid provides a change in the structural color.

In certain embodiments, the method further includes providing a security information below the plurality of reconfigurable structures, wherein the plurality of reconfigurable structures have a geometry and configuration to diffract light and cause an optical fuzziness of the underlying security information.

In certain embodiments, the method further includes introducing a liquid to the plurality of reconfigurable structures that has a refractive index that is similar to the refractive index of the plurality of reconfigurable structures.

In certain embodiments, the document is a banknote, credit card, traveler's cheque, or a personal identification document.

In certain embodiments, the document is a banknote.

In certain embodiments, the document is a passport or a driver's license.

In certain embodiments, the plurality of reconfigurable structures is a polymer.

In certain embodiments, the polymer substrate and the reconfigurable structures comprise polypropylene, polyethylene, or combinations thereof.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which:

FIGS. 3A and 3B show images of an exemplary polymer banknote containing the security feature described herein in accordance with certain embodiments;

FIG. 6 1-4 images illustrating, in the process of the wetting upon the introduction of liquid and drying, the change of the configuration of a plurality of reconfigurable structures on the surface of a polymer banknote in accordance with certain embodiments;

DETAILED DESCRIPTION OF THE INVENTION

The key advantages of using polymer as banknote material over the traditional papers are longer life time (i.e., at least 4 times longer than that of the paper), greater tear resistant and durability, liquid resistant, as well as increased difficulty in counterfeiting compared to the traditional paper-based banknote. This leads to the progressive popularity on the use of polymer-based banknote.

To further enhance the security features of the polymer-based banknotes, security features based on nano/micromechanical structures is provided. In certain embodiments, the security feature can be formed on at least a portion of the polymer banknote without the need to utilize any ink to fabricate and detect the anti-counterfeiting security feature. This approach is not currently available in the existing anti-counterfeiting methods for polymer-based banknotes, where specialized security feature patterns are printed on a polymer banknote with inks.

In certain embodiments, a suite of ink-free anti-counterfeiting methods utilizing 3D nano/micromechanical structures fabricated on polymeric substrates, are provided. In certain embodiments, the structures are capable of producing dynamic, visually distinctive optical effects in both wet and dry environments for enhanced security features in polymer-based banknote and alike.

In certain embodiments, the geometries and the morphologies of these nano/micromechanical structures are engineered such that they have strong interactions with visible light to create optical scattering and diffraction effects, as well as tailored structural flexibility for enhanced robustness.

In addition, the nano/microstructured surfaces can be manufactured through a variety of different approaches that are reported in the literature, and can be made compatible with the current manufacturing technologies for polymer-based banknotes. In particular, two novel and inventive features of the anti-counterfeiting methods include the use of three-dimensional flexible nano/microstructures, as well as the utilization of ordinary liquids, such as alcohols and water (e.g., vapors from breath), for enhanced visualization of the anti-counterfeiting features.

The security features developed herein can be used either independently or in combination with other anti-counterfeiting methods to maximize the anti-counterfeiting effects. Moreover, considering one of the main factors determining the lifetime of polymer banknotes is deterioration due to faded inks, the idea of ink-free polymer banknotes can significantly increase the lifetime of the polymer banknotes as well as environmental benefits.

Figure 1:
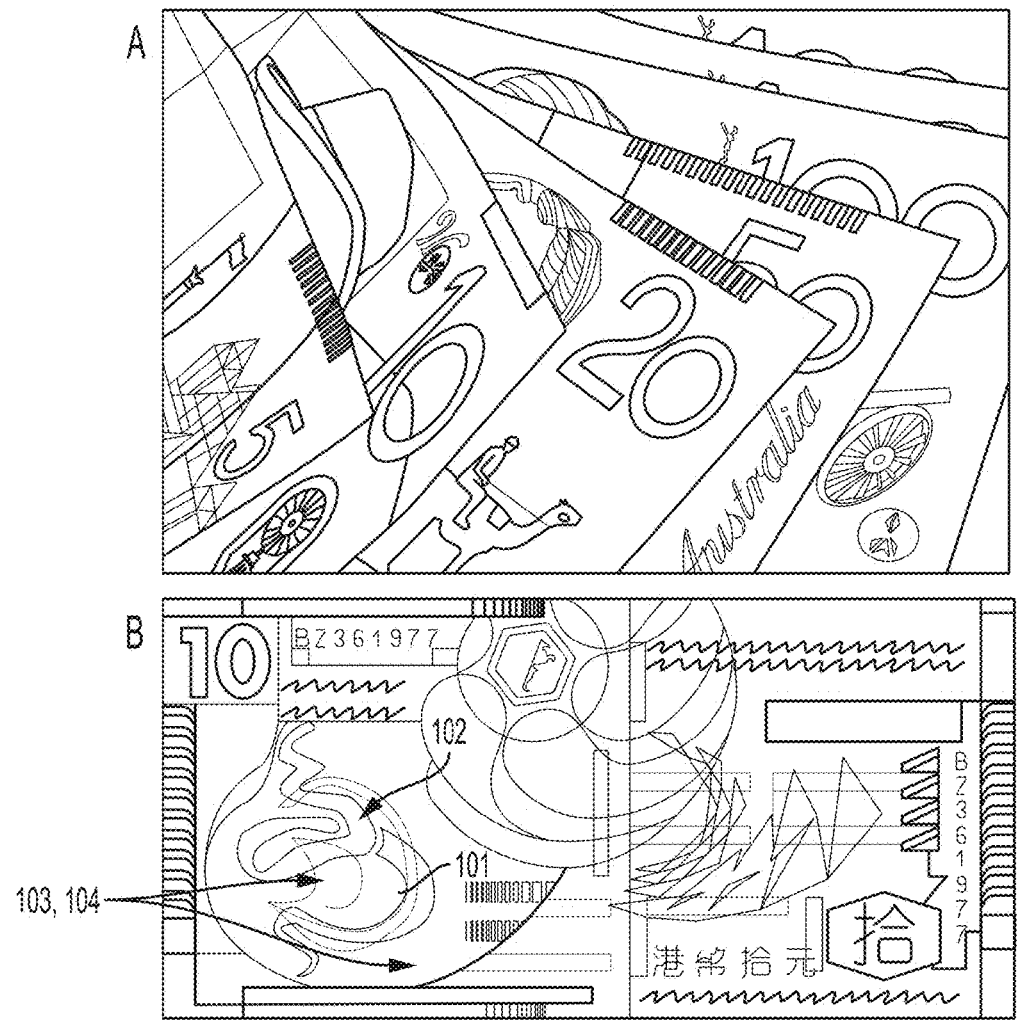
FIG. 1 A-B is an image of a polymer banknote in accordance with certain embodiments.
Figure 2A:
FIGS. 2A and 2B show images of an exemplary polymer banknote containing the security feature described herein in accordance with certain embodiments.
Figure 2B:
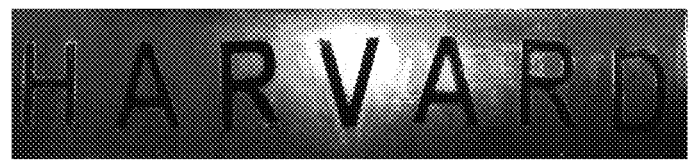

FIG. 2A shows an exemplary security element with the anti-counterfeiting feature provided thereon. As shown, despite the lack of any ink deposited thereon, particularly the areas that spell out "HARVARD," strong optical response, in the form of iridescence, is shown. Moreover, as shown in FIG. 2B, the optical response can change upon introduction of a liquid to provide further anti-counterfeiting feature.

Figure 3:
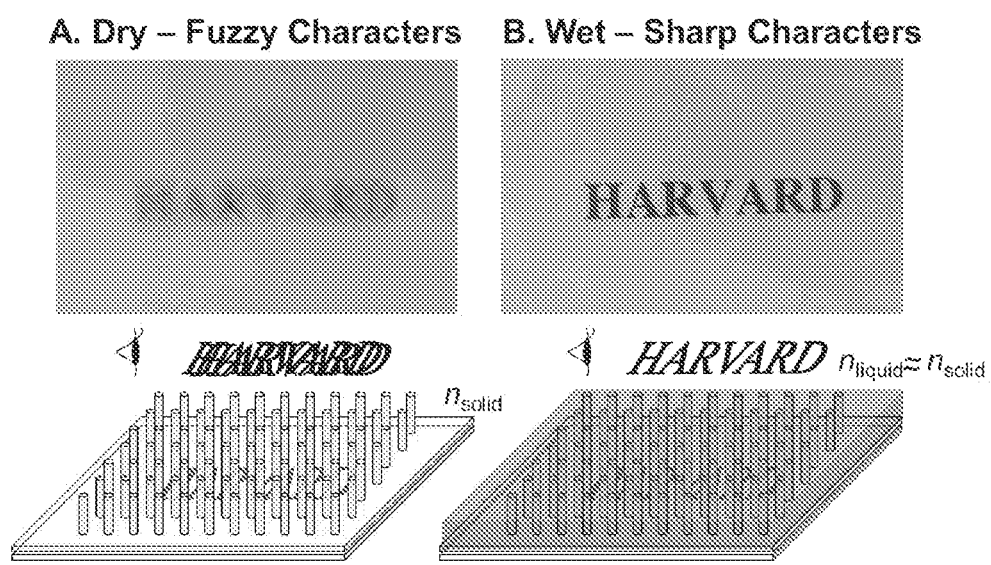

In another embodiment, FIG. 3A shows a second exemplary security element with anti-counterfeiting features provided thereon. As shown, the anti-counterfeiting feature can provide an optical fuzziness to the underlying information printed as "HARVARD." Then, as shown in FIG. 3B, the optical fuzziness can disappear to display a clear information upon introduction of a liquid to provide anti-counterfeiting feature.

Other embodiments that change the optical characteristics of the banknote, by utilizing reconfigurable structures provide on the surface of the banknotes can be provided. For example, in certain embodiments, the reconfigurable structures may not show any optical effect until the introduction of the liquid. In certain embodiments, the reconfigurable structures may show an optical effect that may disappear upon introduction of a liquid.

Figure 4:
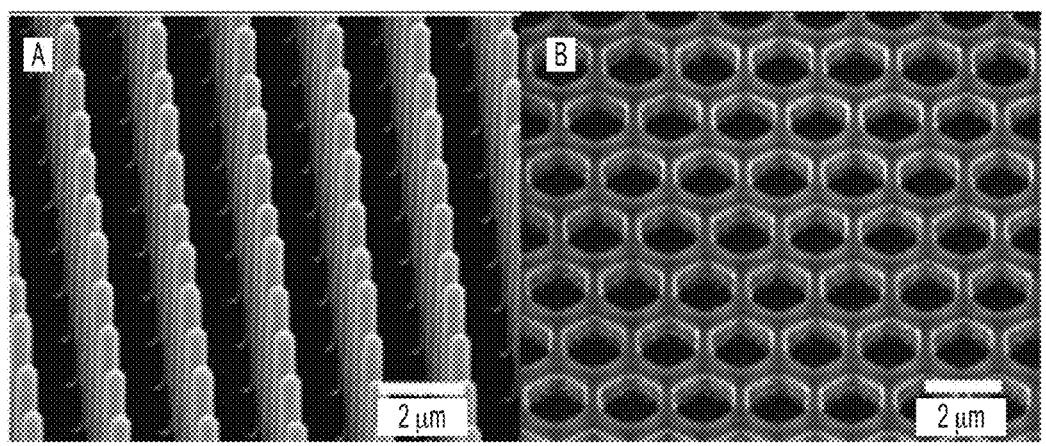
FIG. 4 A-B is an image showing a plurality of reconfigurable structures in accordance with certain embodiments.

In certain embodiments, as shown in FIG. 4, the security features can be provided by producing a number of reconfigurable structures in arbitrary geometries over a polymer substrate. As used herein, "reconfigurable structures" refer to raised nanoscopic to microscopic-sized structures formed over a substrate at predetermined geometry and configuration (e.g., height, thickness, separation distance and the like) that act in concert to provide visual appearance or optical effect at visible wavelengths, such as providing structural color or variation in optical clarity. e.g., changing between sharply focused and fuzziness. "Reconfigurable structures" are not meant to cover conventional security markings, such as watermarks, holograms and the like.

Figure 5:
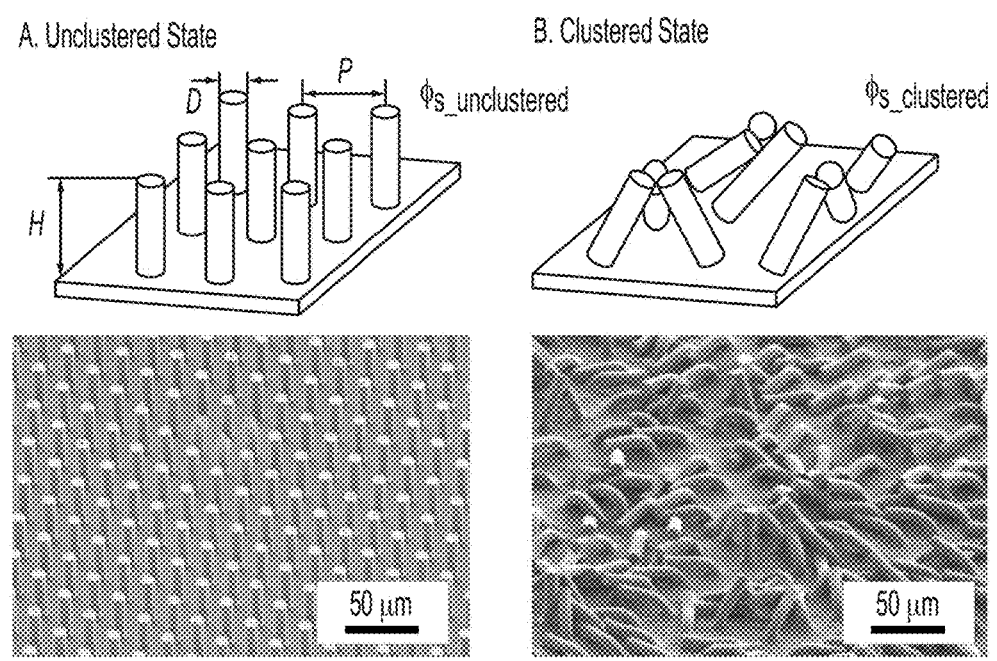
FIG. 5 A-B shows a surface having reconfigurable structures in an unclustered and clustered configurations in accordance with certain embodiments.

The surface can include a number of reconfigurable structures at a solid area fraction, $\Phi_s$. In certain embodiments, as shown in FIG. 5A, solid area fraction can be measured when the reconfigurable structures are free-standing and are unclustered, denoted as $\Phi_{s\_unclustered}$. In certain embodiments, as shown in FIG. 5B, solid area fraction can be measured when the reconfigurable structures are clustered together, denoted as $\Phi_{s\_clustered}$.

The reconfigurable structures can include an array of reconfigurable structures, such as posts that are cylindrical, rectangular, pyramidal, conical and the like. For optical effects, the spacing between structures can be on the orders of 100 nanometers to a few micrometers making it comparable to the wavelength of the visible light. The characteristic sizes of the individual structures (i.e., height, diameter, and pitch of the structures, denoted as H, D, and P respectively) can be designed such that they lead to a desired optical effect. Based on these geometrical parameters, $\Phi_{s\_unclustered}$ can be quantitatively expressed as $\pi(D/2)^2/P^2$.

The reconfigurable structures can be made using a variety of different polymer, such as polypropylene, such as biaxially-oriented polypropylene, polyethylene, epoxy resin, polydimethylsiloxane, and the like. The materials of the surface can be robust and flexible, with bending stiffness that can be tailored to allow the reconfigurable structures to alter its configuration with the addition and/or removal a liquid. For example, surfaces may have employed materials with elastic moduli E, ranging from 1 MPa to 10 GPa depending on the geometry of the structures which may have dimensions ranging from 10 nm to 10 s of microns in radius, and length of submicrons to millimeters. In certain embodiments, the reconfigurable structures may be spaced apart at distances that are comparable to the wavelength of light, such as 100 nm to several microns.

In certain embodiments, for applications where optical transparency is important, the clustered solid fraction, $\Phi_{s\_clustered}$ (i.e., when the surface structures are clustered), can be selected to maximize the light transmission through the surface. In particular, the upper limit of $\Phi_{s\_clustered}$ for cylindrical surface structures can be quantitatively estimated as $NDH/P^2$, where N is a constant related to the spatial arrangement of the surface structures (e.g., N=4 for square lattice arrangement).

In certain embodiments, these reconfigurable structures can be manufactured by any suitable methods, such as soft lithography techniques, replica molding, embossing, nanotube growth from the surface, fiber spinning, printing and the like. In particular, the reconfigurable structures can be produced as part of the current manufacturing technique that is used in producing polymer banknotes. For example, a certain conventional polymer banknote utilizes a biaxially oriented polypropylene (BOPP) where a polypropylene is biaxially stretched using a blow-up process. The biaxially stretched polypropylene is then taken up on a mandrel for subsequent ink printing. The ink printing is typically carried out using a roll-to-roll processing, where ink is applied to the BOPP. An additional process step, such as hot embossing, can be inserted into this conventional processing setup where the rollers can contain features that can be produced onto desired regions of the BOPP films, either before or after the ink is printed thereon. The formed surface structures may be unclustered as shown in FIG. 5A. Upon application of a suitable liquid and subsequent drying, the surface structures can be reconfigured to form a clustered structure as shown in FIG. 5B.

The security features of the present disclosure can operate utilizing separate, but combinable, modes of operation. First, security features may be provided by utilizing the structural colors that can arise from the nano/micromechanical structures formed on the substrate. Second, security features may be provided by dynamically changing the structural color that arises, for example, by exposing the security features to liquids. Third, security features may be provided by using diffraction and hazing of the underlying image or information formed on the underlying substrate. Fourth, security features may be provided by removing or reducing the diffraction and hazing of the underlying image or information formed on the underlying substrate.

Generally, the reconfigurable structures can be designed to provide a desired structural color and/or degree of diffraction of the underlying information provided on the substrate. Dynamic changes to these security features can be provided by introduction of a liquid.

Generally, any liquid that does not adversely affect the reconfigurable structures on the surface (e.g., damaging the reconfigurable structures) can be utilized. For a fast reading of optical effects, liquids with medium to high vapor pressures can be utilized. In certain embodiments, the liquids may further contain disinfecting properties, such as an antibacterial, germicidal, antivirus/pathogen and the like properties. Suitable liquids include water, ethanol, hydrogen peroxide, isopropanol, acetone, and the like. Suitable liquids also include vapors of water, ethanol, hydrogen peroxide, isopropanol, acetone, and the like. For example, vapors from breath of a user can be utilized.

Structural Colors and Dynamic Changes to Structural Colors

The first and second security features described above makes use of the phenomenon of structural color based on the unique feature that arise due to the periodic surface features, whose length scales are on the orders of 100 nanometers to a few micrometers. Many different structures that exhibit such structural colors can be found in nature, such as butterfly wings, abalone shells, peacock features, and the like.

Figure 6:
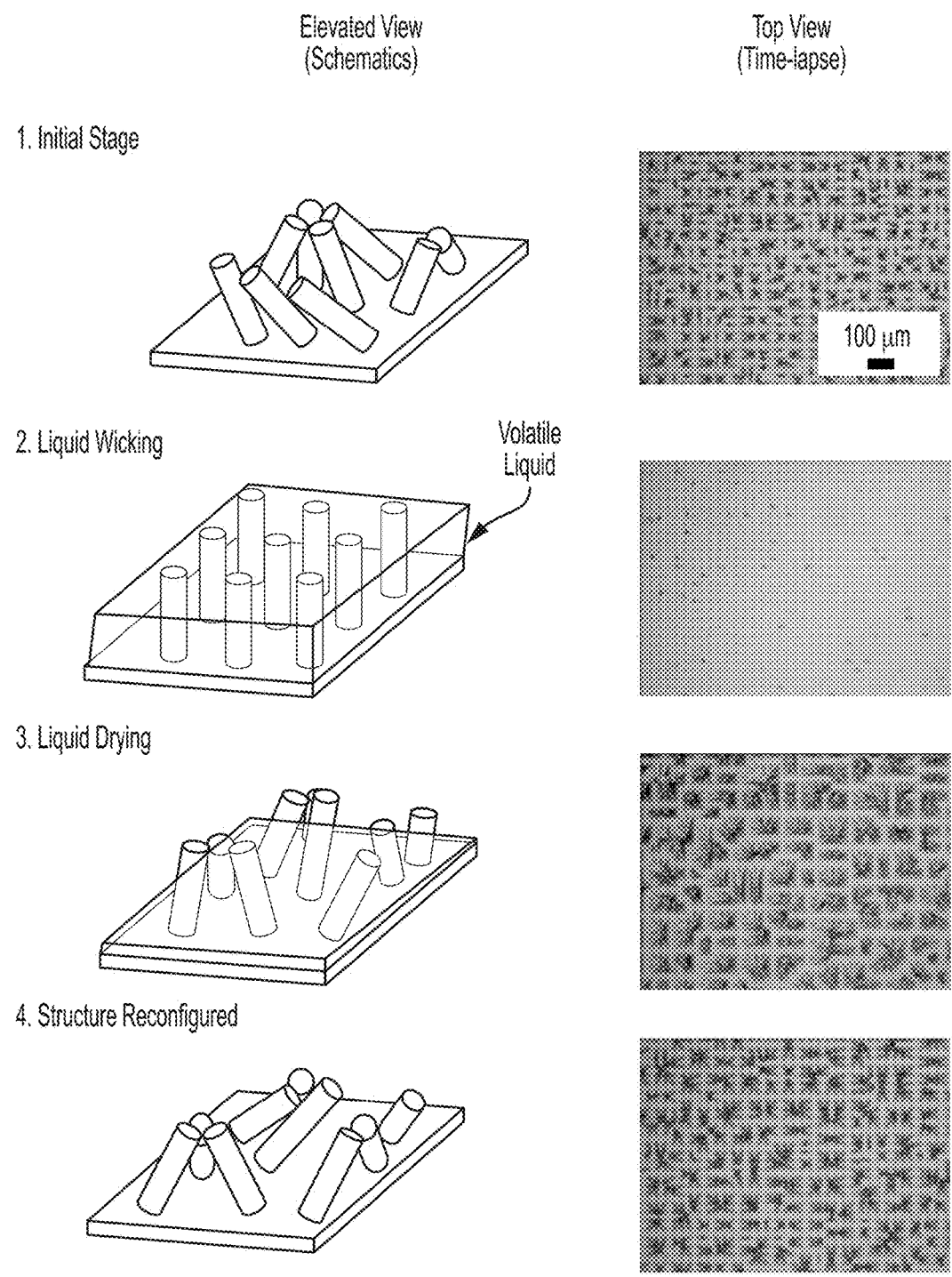

FIG. 6 shows how the surfaces in accordance with certain embodiments of the present invention are able to dynamically alter the structural color formed on a polymer substrate to provide anti-counterfeiting information.

As shown in FIG. 6A, the reconfigurable structures can provide structural color (not shown) in the initial stage, where the array of reconfigurable structures may be in a clustered structure. In certain embodiments, the initial structure may not provide any structural color.

Upon introduction of a liquid as shown in FIG. 6B, the liquid may be wicked into the structure. Wicking of the liquid can lead to unclustering of the reconfigurable structures. In certain embodiments, the wicking of the liquid can lead to a loss of the structural colors. In certain embodiments, the wicking of the liquid can lead to an enhancement of the structural colors.

As the liquid evaporates (see FIGS. 6C and 6D), the reconfigurable structures eventually cluster together again leading to a randomized clustered structure leading to the structural color (or absence thereof) that was present in FIG. 6A. As a result, during the surface reconfiguration process, the effective solid area fraction, $\Phi_{s\_effective}$, of the surface falls within the range of $\Phi_{s\_unclustered} \leq \Phi_{s\_effective} \leq \Phi_{s\_clustered} \leq 1$.

Figure 7:
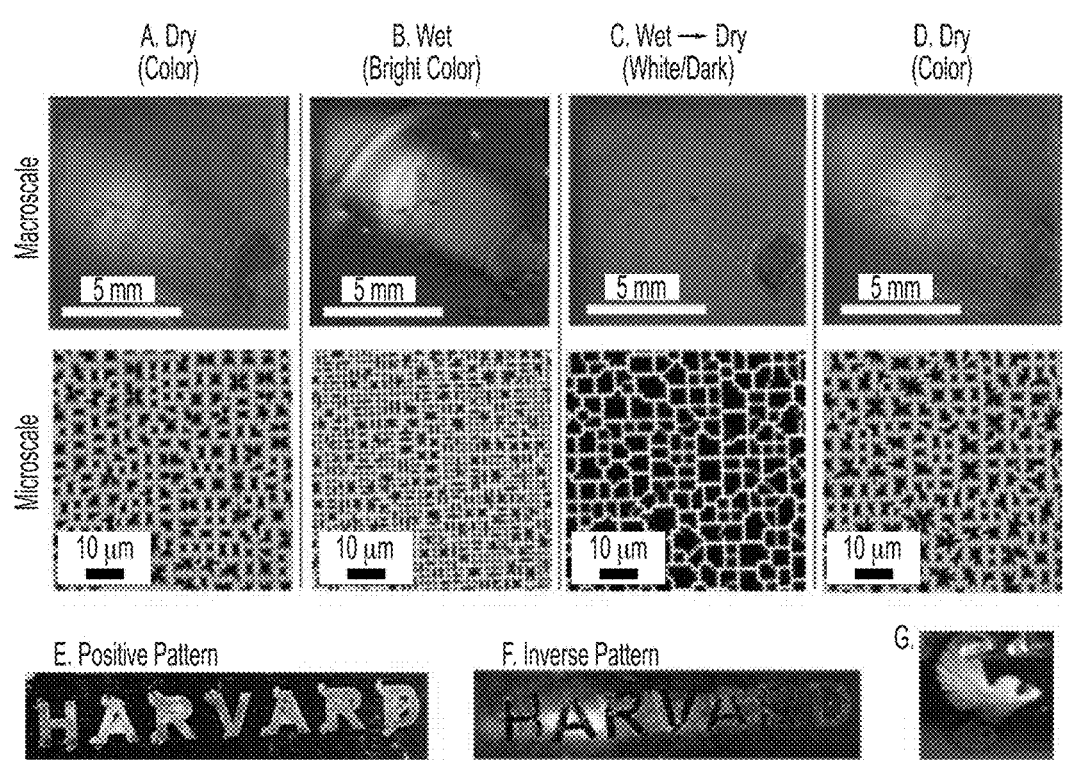
FIGS. 7A-7F show images illustrating how to change the structural color shown on the surface of a polymer banknote using a plurality of reconfigurable structures in accordance with certain embodiments.
FIG. 7G shows a holographic anti-counterfeiting image in accordance with conventional arts.

A disordered structured surface was fabricated using epoxy resin, with surface features in the form of high-aspect-ratio cylindrical structures. When the surface is in a dry state, it displays a pearl-like color due to the coherent scattering of light from the structures (see FIG. 7A). When a wetting liquid, such as alcohol, is applied to the surface, the surface wicks the liquid completely due to surface topography-induced wetting. The liquid wetting process causes the nano/microstructures to be unclustered partially, which greatly enhances the structural color effect (FIG. 7B). While not wishing to be bound by theory, enhanced iridescence may arise due to enhanced ordering of the reconfigurable structures, leading to a stronger structural color effect. As the liquid evaporates, the structural color disappears as the periodicity of the nano/microstructures is disrupted by the clustering of the nano/microstructures into larger-sized assemblies (FIG. 7C). Upon the completion of the liquid evaporation process, the nano/microstructures restore its original configuration due to their structural flexibility, thereby restoring the original structural color (FIG. 7D).

It is important to note that such a dynamic color switching process cannot be achieved using the current 2D optical grating or holographic technologies, which are employed in the current security documents. For example, certain embodiments of the present invention provides a dynamic optical effects when viewed at a fixed angle upon introduction and removal of a liquid to the reconfigurable structures. Conventional anti-counterfeiting measures do not provide such dynamic optical effect when viewed at a fixed angle. Additionally, security features in the form of arbitrary graphics at high resolution can be fabricated on the polymer surface with nano/micromechanical structures. Characters made by positive and inverse patterns are demonstrated in FIGS. 7E and 7F as a proof of concept. As shown in FIG. 7G, they show very similar visual effect of iridescent colors as that of the currently used hologram security features. The 2D hologram features, however, are not able to present the unique dynamic color switching effect provided by the structures of the present disclosure.

Optical Hazing

The third and fourth security features described above utilize the effect of diffraction to optically distort any embedded characters or images within the polymer substrate. Specifically, diffraction can occur when an electromagnetic wave, with a wavelength $\lambda$, passes through a physical slit with size comparable to or smaller than $\lambda$. By utilizing this physical phenomenon, optical fuzziness of embedded images can be generated through the collective diffraction effects of the 3D nano/micromechanical structures.

In certain embodiments, the materials of the surface can be more rigid than those utilized to effectuate a change in structural color described above. For example, surfaces may employ materials with elastic moduli E, ranging from 1 MPa to 10 GPa depending on the geometry of the structures which may have dimensions ranging from several nm to 10 s of microns in radius, and length of submicrons to millimeters. In certain embodiments, the structures can be made more rigid by increasing the elastic modulus, increasing the diameter or decreasing the height of the structures.

Figure 8:
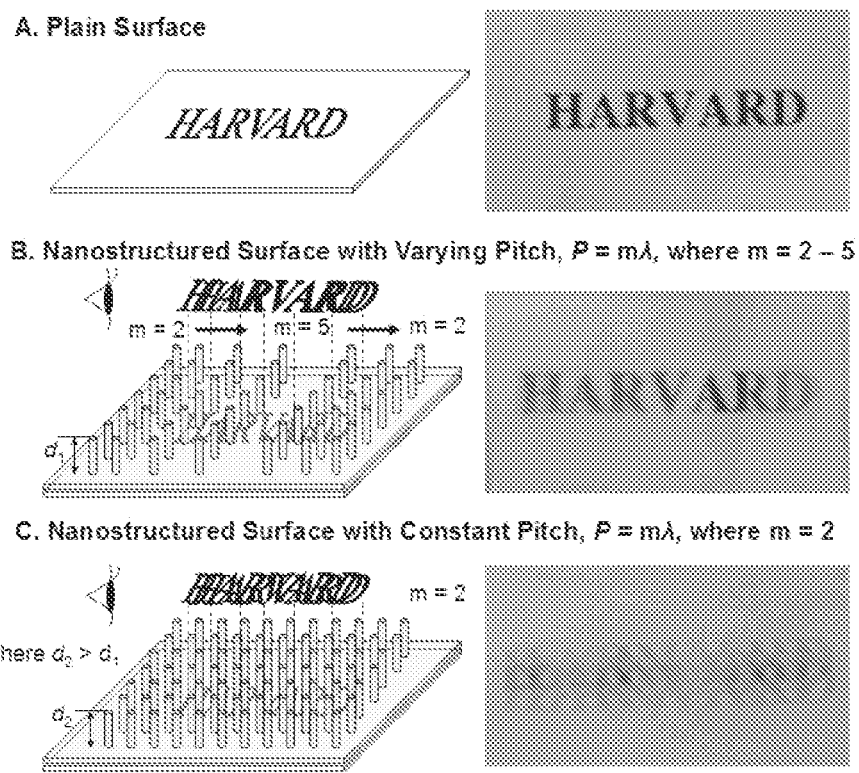
FIG. 8 A-C shows images of utilizing optical fuzziness as an anti-counterfeiting method in accordance with certain embodiments.
Figure 9:
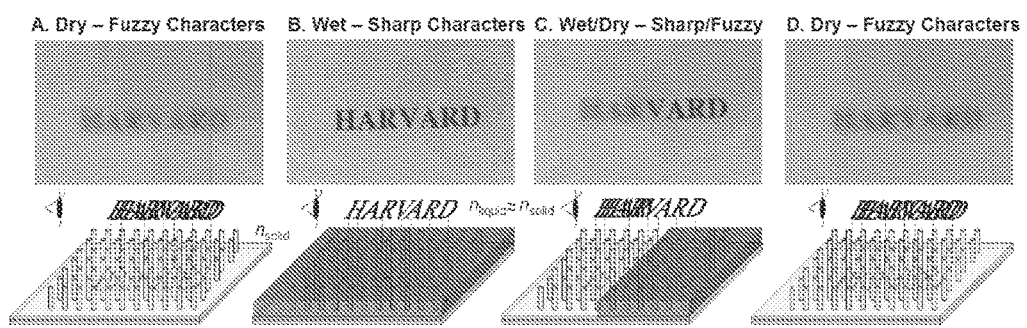
FIG. 9 A-D shows images of utilizing dynamic changes in optical fuzziness as an anti-counterfeiting method in accordance with certain embodiments.

In certain embodiments, a desired image or information can be printed or embedded onto the underlying polymer substrate. FIG. 8A shows "HARVARD" printed thereon. Upon formation of the reconfigurable structures thereon, optical haziness can be introduced. By engineering the geometry and configuration between the individual nano/microstructures (i.e., the pitch), the optical fuzziness of the embedded images can be tuned from highly fuzzy to negligible fuzziness (FIG. 8B). In addition, the optical fuzziness can be further enhanced by adjusting the height of the nano/microstructures at a pitch size less than 1 μm, which are comparable to the wavelengths of light in the visible spectrum (i.e., λ~300 nm to 700 nm) (FIG. 8C and FIG. 9A). This enhanced security feature can be incorporated into the existing security documents, particularly in polymer-based banknote, where characters can be embedded within the 3D nano/micromechanical structures with tuned pitch and height to generate the desired optical fuzziness.

Moreover, by introducing a liquid, optical refractive index matching between two different materials can be induced to create transient optical transparency within the polymer substrate. In particular, when the nano/microstructured surface is wetted with a liquid (e.g. breath, ethanol) whose refractive index, $n_{liquid}$, matches to that of the solid material, $n_{solid}$, the characters that are embedded within the substrate appear to be sharp due to index matching of the materials (i.e, these two different materials optically appear to be the same, see FIG. 9B). Upon drying of the liquid, the surface that stays wet will remain optically transparent, whereas the region that is dried up will appear to be optically fuzzy as illustrated in FIG. 9C. When the surface is completely dried, the optical fuzziness of the characters resume to the original state (FIG. 9D). This feature, when incorporated with security documents, provides a very simple way to identify their authenticity by wet the surface with ordinary liquids or simply by breathing on it.

Buckling of Closed-cell Structures

Figure 10:
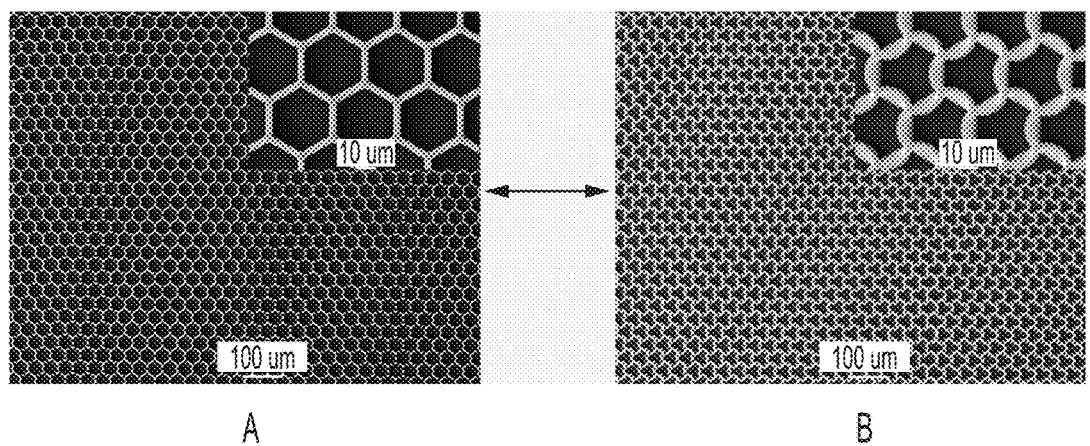
FIG. 10A shows a honeycomb structure without a liquid and FIG. 10B shows the shape generated by swelling-induced buckling, where the new pattern appears by applying a liquid and the original shape is recovered after evaporation of a liquid. The insets show the zoom-in of the corresponding microscope images in accordance with certain embodiments.

In certain embodiments, application of a liquid or pressure can buckle a closed-cell structure, such as for example a honeycomb structure in FIG. 10, and change its appearance. The buckling process can be reversible by using elastic swelling. For example, the original honeycomb shape as shown in FIG. 10A changes to a new shape shown in FIG. 10B as the structures buckle by swelling-induced instability. The original honeycomb shape recovers as the liquid dries by evaporation. By utilizing various polymers and liquids, one can control the onset of the shape transformation. This approach is scale-independent and it is also possible to tune the buckled pattern by controlling dimensions of the original structure. Moreover, this approach is applicable to other ordered and disordered cellular structures besides honeycombs.

Moire Pattern Formation

Figure 11:
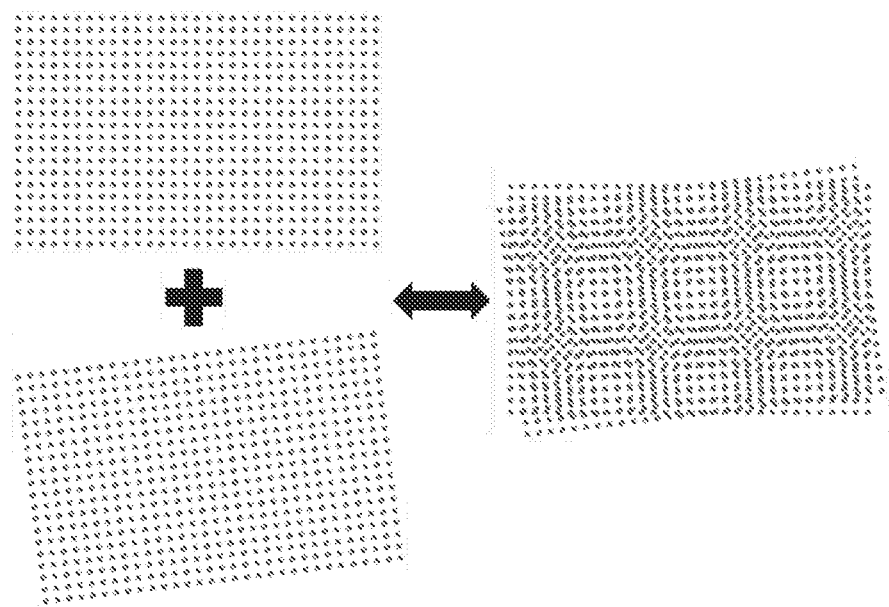
FIG. 11 shows the appearance of a Moire patterns by superimposing two different patterns, where the Moire patterns disappear when the two different patterns are separated from each other in accordance with certain embodiments.

In certain embodiments, two arrays of structures at the opposite sides of the banknote can generate a new pattern upon superposition by folding the note. Superposition of two patterned surface can generate a new pattern as schematically shown in FIG. 11. This effect is known as Moire effect and the generated pattern (hereinafter referred to as "Moire pattern") is tunable by changing the mismatch angle between two patterned (periodic or aperiodic) surfaces. This phenomenon is reversible. The pattern disappears as two surfaces are separated.

Figure 12:
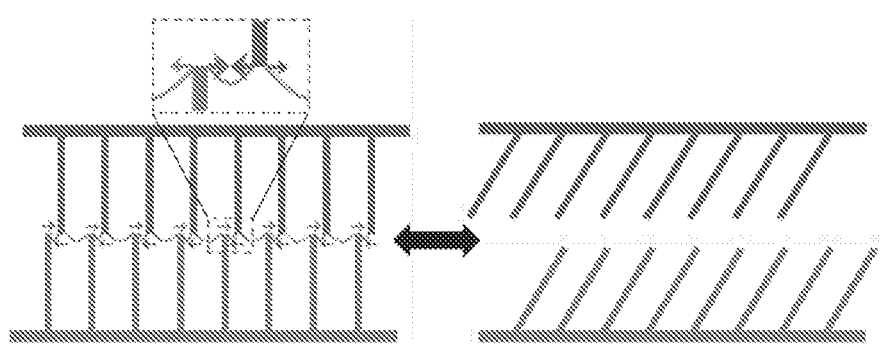
FIG. 12 shows introduction of a liquid into the superimposed Moire pattern, where the interaction between structures and the liquid can induce bending of the structures, which then provides further changes to the Moire pattern.

Moreover, dynamically changing patterns can be formed by introducing a liquid into the Moire pattern. In this case, interaction of the structures with a liquid can induce bending of the structures as schematically shown in FIG. 12 based on elastocapillary effect discussed above providing a new optical effect. Moreover, the interaction of the structures with the liquid can change the Moire pattern as the liquid is evaporated. Hence, a dynamic Moire pattern whose behaviors can be controlled by geometries and materials properties of the patterns embedded on the note can be provided. While posts are shown in FIGS. 11 and 12, any combination of structures having the desired geometry and configuration can be utilized.

Other Embodiments

Many different embodiments can be envisioned, such as providing both fuzziness and structural colors for combined security features. For example, clustering and unclustering of the reconfigurable structures can be controlled (e.g., providing different reconfigurable structures or different types of liquids) so that it provides both dynamic fuzziness and/or structural color effects. In certain instances, use of a particular liquid may lead to clustering and unclustering of the reconfigurable structures and change the structural color aspects whereas as use of another liquid may lead to introduction/loss of fuzziness. Many different embodiments can be envisioned.

Advantages

All above has shown that this novel 3D, dynamic ink-free security features are unique, difficult to counterfeit, and simple to be recognized by general public. This technique is a breakthrough of the existing 2D anti-counterfeiting concept and would substantially advance the anti-counterfeiting technology. Importantly, this pure structure-coloring is capable of realizing ink-free polymer bank notes with security features by using embossing techniques on polymer substrates, well compatible with low cost, high throughput roll-to-roll manufacturing technologies. As a result, ink-free polymer banknote can reduce the manufacturing cost in addition to increased lifetime, which would be strong incentives for the transformation to the polymer money. In addition, polymeric banknotes are completely recyclable by melting them into other useful forms, which will be more environmentally friendly compared to the current paper-based money disposal methods.

The unique security features disclosed herein can be broadly applied to general polymer-based or polymer encapsulated security documents, particularly banknotes, credit cards, traveler's cheques, and personal identification documents, such as passport and driver's license. In addition, these features can also be used in packaging and labeling industries, where anti-counterfeiting for products are desired.

Upon review of the description and embodiments provided herein, those skilled in the art will understand that modifications and equivalent substitutions may be performed in carrying out the invention without departing from the essence of the invention. Thus, the invention is not meant to be limiting by the embodiments described explicitly above.

What is claimed is:

1. A document comprising:
   a security element, said security element comprising
   a polymer layer comprising a plurality of reconfigurable structures formed on a surface of the polymer layer;
   wherein the plurality of reconfigurable structures have a geometry and configuration capable of providing an optical effect that is visible with the human eye,
   wherein the plurality of reconfigurable structures are capable of altering the configuration and corresponding optical effect of the plurality of reconfigurable structures upon application of a liquid or pressure,
   wherein the plurality of reconfigurable structures have a separation distance to provide a structural color, and
   wherein the security element is formed over at least a portion of the document.

2. The document of claim 1, wherein the document is a credit card or a traveler's cheque.

3. The document of claim 1, wherein the document is a banknote.

4. The document of claim 1, wherein the document is a personal identification document.

5. The document of claim 1, wherein the document is a passport or a driver's license.

6. The document of claim 1, wherein the plurality of reconfigurable structures comprises a polymer.

7. The document of claim 6, wherein the polymer substrate and the plurality of reconfigurable structures comprise polypropylene, polyethylene, or combinations thereof.

8. A document comprising:
a security element, said security element comprising
a polymer layer comprising a plurality of reconfigurable structures formed on a surface of the polymer layer;
a security information located below the plurality of reconfigurable structures, wherein
the plurality of reconfigurable structures have a geometry and configuration to diffract light and alter the appearance of the security information when viewed through the reconfigurable structures,
wherein the plurality of reconfigurable structures have a geometry and configuration capable of providing an optical effect that is visible with the human eye,
wherein the plurality of reconfigurable structures are capable of altering the configuration and corresponding optical effect of the plurality of reconfigurable structures upon application of a liquid or pressure, and
wherein the security element is formed over at least a portion of the document.

9. The document of claim 8, wherein the plurality of structures have a separation distance to provide a structural color.

10. The document of claim 9, further comprising:
a liquid provided to the plurality of reconfigurable structures to form a change in the structural color.

11. A method for screening a document, comprising:
providing a document having a security element that comprises a polymer layer having a plurality of reconfigurable structures formed on a surface of the polymer layer, wherein the plurality of reconfigurable structures have a geometry and configuration for providing an optical effect that is visible with the human eye, wherein the plurality of reconfigurable structures have a geometry and configuration to provide a structural color; and
introducing a liquid to the plurality of reconfigurable structures to form a change in the configuration and corresponding optical effect and to provide a change in the structural color.

12. The method of claim 11, further comprising:
providing a security information below the plurality of reconfigurable structures, wherein
the plurality of reconfigurable structures have a geometry and configuration to diffract light and cause an optical fuzziness of the underlying security information.

13. The method of claim 12, further comprising:
introducing a liquid to the plurality of reconfigurable structures that has a refractive index that is similar to the refractive index of the plurality of reconfigurable structures to cause a change in fuzziness.

14. The method of claim 11, wherein the document is a banknote, credit card, traveler's cheque, or a personal identification document.

15. The method of claim 11, wherein the document is a banknote.

16. The method of claim 11, wherein the document is a passport or a driver's license.

17. The method of claim 11, wherein the plurality of reconfigurable structures is a polymer.

18. The method of claim 17, wherein the polymer substrate and the reconfigurable structures comprise polypropylene, polyethylene, or combinations thereof.

* * * * *